(12) United States Patent
Stolze

(10) Patent No.: US 9,373,563 B2
(45) Date of Patent: Jun. 21, 2016

(54) SEMICONDUCTOR ASSEMBLY HAVING A HOUSING

(75) Inventor: Thilo Stolze, Arnsberg (DE)

(73) Assignee: Infineon Technologies AG, Neubiberg (DE)

(*) Notice: Subject to any disclaimer, the term of this patent is extended or adjusted under 35 U.S.C. 154(b) by 1115 days.

(21) Appl. No.: 11/780,790

(22) Filed: Jul. 20, 2007

(65) Prior Publication Data

US 2009/0021916 A1 Jan. 22, 2009

(51) Int. Cl.
| | |
|---|---|
| H01L 23/06 | (2006.01) |
| H01L 23/48 | (2006.01) |
| H01L 21/50 | (2006.01) |
| H01L 23/04 | (2006.01) |
| H01L 23/053 | (2006.01) |
| H01L 23/16 | (2006.01) |
| H01L 25/07 | (2006.01) |
| H01L 23/00 | (2006.01) |

(52) U.S. Cl.
CPC ............... *H01L 23/48* (2013.01); *H01L 21/50* (2013.01); *H01L 23/04* (2013.01); *H01L 23/053* (2013.01); *H01L 23/16* (2013.01); *H01L 25/072* (2013.01); *H01L 24/48* (2013.01); *H01L 2224/32188* (2013.01); *H01L 2224/48091* (2013.01); *H01L 2224/48227* (2013.01); *H01L 2924/01015* (2013.01); *H01L 2924/01068* (2013.01); *H01L 2924/16195* (2013.01)

(58) Field of Classification Search
CPC ..... H01L 31/045; H01L 31/048; H01L 21/50; H01L 23/16; H01L 25/072; H01L 2924/01068; H01L 2224/32188; H01L 2224/48227; H01L 2924/16195; H01L 2924/00014

USPC ............................ 257/E23.084, 684, 706, 707
See application file for complete search history.

(56) References Cited

U.S. PATENT DOCUMENTS

| | | | | |
|---|---|---|---|---|
| 4,546,410 | A * | 10/1985 | Kaufman | 361/705 |
| 5,297,001 | A * | 3/1994 | Sterling | 361/717 |
| 5,724,229 | A * | 3/1998 | Tustaniwskyi et al. | 361/719 |
| 5,881,453 | A * | 3/1999 | Avery et al. | 29/834 |
| 6,779,204 | B1 | 8/2004 | Ciotic | |
| 6,791,183 | B2 * | 9/2004 | Kanelis | 257/718 |
| 6,867,484 | B2 | 3/2005 | Nakajima et al. | |
| 6,979,204 | B2 | 12/2005 | Goebl et al. | |
| 7,034,395 | B2 * | 4/2006 | Stolze | H01L 23/16 |
| | | | | 257/675 |

(Continued)

FOREIGN PATENT DOCUMENTS

| | | |
|---|---|---|
| DE | 102004037656 A1 | 3/2006 |
| WO | 2006027040 A1 | 3/2006 |

OTHER PUBLICATIONS

The Office Action for Chinese Patent Application No. 200810137776.2 issued Oct. 30, 2009 (pp. 1-4 and 1-12).

(Continued)

*Primary Examiner* — Cuong B Nguyen
(74) *Attorney, Agent, or Firm* — Dicke, Billig & Czaja, PLLC

(57) ABSTRACT

A semiconductor assembly, power semiconductor module, a housing and methods for assembling the power semiconductor housing is disclosed. One embodiment provides an electrically insulating substrate has an inner housing having a cover and a peripheral rim, and at least one pressure element arranged adjacent a side-face of the peripheral rim. The pressure element is resiliently coupled to the inner housing.

23 Claims, 3 Drawing Sheets

(56) References Cited

U.S. PATENT DOCUMENTS

| | | | |
|---|---|---|---|
| 7,939,937 B2* | 5/2011 | Holzmann | B81B 7/0058 257/711 |
| 2002/0070439 A1* | 6/2002 | Hiramatsu et al. | 257/687 |
| 2004/0217465 A1 | 11/2004 | Stolze | |
| 2006/0150751 A1* | 7/2006 | Stolze | 73/862.041 |
| 2007/0194429 A1* | 8/2007 | Lederer et al. | 257/688 |
| 2007/0202721 A1* | 8/2007 | Stolze et al. | 439/108 |
| 2007/0272976 A1* | 11/2007 | Popp et al. | 257/328 |
| 2007/0278669 A1 | 12/2007 | Hierholzer et al. | |

OTHER PUBLICATIONS

The Office Action for German Patent Application No. 10 2008 033 465.8-33 mailed Jul. 5, 2010.

* cited by examiner

SEMICONDUCTOR ASSEMBLY HAVING A HOUSING

BACKGROUND

The present application relates to a power semiconductor module and a housing for a power semiconductor module.

A power semiconductor module providing at least two power semiconductor components such as power transistors which, during operation, generate heat. The power semiconductor components are mounted on an electrically insulating substrate, for example a ceramic substrate, within the module. The module also includes typically a housing which is arranged so as to surround the power semiconductor components and protect them from damage. Due to the heat generated by power semiconductor components during operation, the insulating substrate of the power semiconductor module is typically attached to a heat sink. The module may be attached to the heat sink by pressure contact produced by a force exerted on the housing by a fastening means such as a screw. A considerable force on the housing is needed to ensure the heat transfer from the insulating substrate to the heat sink. An excessive force on the housing may damage the insulating substrate irreversibly.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
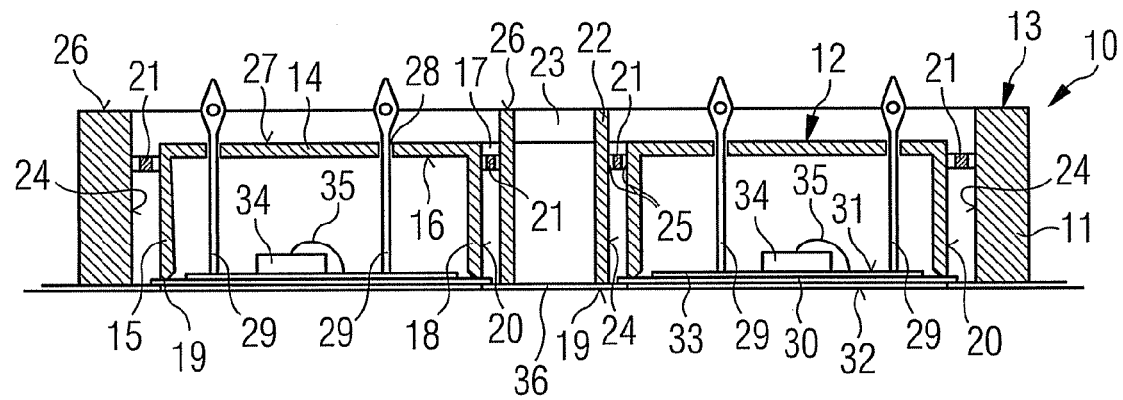
FIG. 1 illustrates a cross-sectional view of a housing for a power semiconductor module.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a power semiconductor module including a housing for a power semiconductor module. In one embodiment, the housing includes an electrically insulating substrate, wherein the housing includes an inner housing including a cover and a peripheral rim, and at least one pressure element arranged adjacent a side-face of the peripheral rim. The pressure element is resiliently coupled to the inner housing.

In another embodiment, a power semiconductor module is disclosed wherein the power semiconductor module includes an electrically insulating substrate including an electrically insulating body having a first primary surface and a second primary surface, at least one power semiconductor component mounted on the first primary surface of the electrically insulating substrate, and a housing including an inner housing including a cover and a peripheral rim, and at least one pressure element arranged adjacent a side-face of the peripheral rim. The pressure element is resiliently coupled to the inner housing.

In another embodiment, a method is disclosed, the method including the processes of providing an electrically insulating substrate including an electrically insulating body having a first primary surface and a second primary surface, and at least one power semiconductor component mounted on the first primary surface;

providing a housing including an inner housing including a cover and a peripheral rim, and at least one pressure element arranged adjacent a side-face of the peripheral rim, the pressure element being resiliently coupled to the inner housing;

arranging the housing such that the lower surface of the peripheral rim of the inner housing is arranged in contact with the first primary surface of the electrically insulating substrate and the at least one pressure element is arranged adjacent a side-face of the electrically insulating substrate and spaced at a distance from a surface to which the housing and electrically insulating substrate is to be attached;

applying pressure to the upper surface of the pressure element of the housing such that the lower surface of the pressure element comes into contact with the surface and such that pressure is exerted on the peripheral rim of the inner housing as a result of the resilient coupling between the pressure element and the inner housing so as to attach the housing and the second primary surface of the electrically insulating substrate to the surface.

In another embodiment, a method is disclosed, the method including the processes of providing an electrically insulating substrate including an electrically insulating body having a first primary surface and a second primary surface, and at least one power semiconductor component mounted on the first primary surface, a plurality of pins each having a pressure contact region extending generally perpendicularly from the first primary surface of the electrically insulating substrate; providing a housing including an inner housing including a cover and a peripheral rim, and at least one pressure element arranged adjacent a side-face of the peripheral rim, the pressure element being resiliently coupled to the inner housing;

providing a rewiring board including a plurality of through-holes, each through-holes being configured to effect a pressure contact with a pressure contact pin; arranging the housing such that the lower surface of the peripheral rim of the inner housing is arranged in contact with the first primary surface of the electrically insulating substrate and the at least one pressure element is arranged adjacent a side-face of the electrically insulating substrate and spaced at a distance from a surface to which the housing and electrically insulating substrate is to be attached;

arranging the rewiring board on an upper surface of the pressure element so that a pressure contact pin is arranged in each of the through-holes and to effect a pressure contact between the rewiring board and the pressure contact pin;

applying pressure to the upper surface of the pressure element of the housing such that the lower surface of the pressure element comes into contact with the surface and such that pressure is exerted on the peripheral rim of the inner housing as a result of the resilient coupling between the pressure element and the inner housing so as to attach the housing and the second primary surface of the electrically insulating substrate to the surface.

Figure 2:
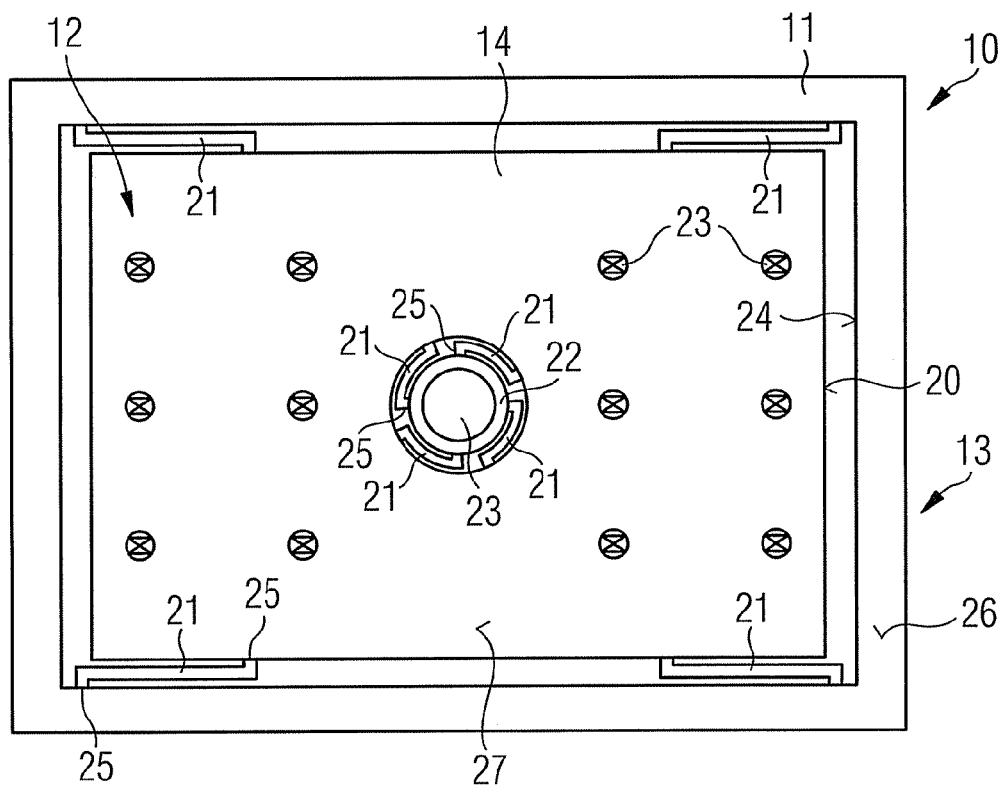
FIG. 2 illustrates a top view of the housing of FIG. 1.

FIG. 1 illustrates a cross-section of a semiconductor assembly including a housing 10 for a power semiconductor module. A top view of the housing 10 of FIG. 1 is illustrated in FIG. 2. The housing 10 includes an inner housing 12 and a pressure element 13. The inner housing 12 includes a cover 14 and a peripheral rim 15 which extends from a lower surface 16 of the cover 14. The peripheral rim 15 may have the form of a closed frame or an open cylinder. As illustrated in the top view of FIG. 2, an upper surface 27 of the cover 14 has a rectangular shape and an upper surface 26 of the peripheral rim 15 has the shape of a rectangular frame. Other shapes for the cover 14 and the peripheral rim 15 are also possible.

The inner housing 12 further includes a through-hole 17 which is bounded by a cylindrical wall 18 having a height and thickness which generally corresponds to the height and thickness of the peripheral rim 15. The cylindrical wall 18 may be part of the peripheral rim 15 as illustrated in FIG. 1. Alternatively, the cylindrical wall 18 may be attached to the peripheral rim 15. The through-hole 17 and cylindrical wall 18 are positioned in approximately the lateral centre of the cover 14.

The inner housing 12 provides an enclosed volume when the lower surface 19 of the peripheral rim 13 and the cylindrical wall 18 are brought into contact with a surface of a substrate 30 facing the inner housing 12.

The housing 10 also includes a pressure element 13 which is arranged concentrically adjacent to outer side-faces 20 of the inner housing 12. The pressure element 13 is spaced at a distance from the outer side-faces 20 of the inner housing 12 and is resiliently coupled to the inner housing 12 by a plurality of resilient coupling members 21. The coupling member 21 may be provided by a resilient strip as illustrated in FIG. 1.

The pressure element 13 includes a frame 11 having lateral dimensions slightly larger than the lateral dimensions of the cover 14 and the peripheral rim 15 of the inner housing 12. The pressure element 13 also includes at least one cylinder 22 which is positioned concentrically within the through-hole 17 provided in the inner housing 12. It is also possible to use elements of other forms than that of the cylinder 22 to be positioned concentrically within the through-hole 17. The cylinder 22 provides a first through-hole 23 which acts as a guide for a screw, which is not illustrated in FIGS. 1 and 2, with which the housing 10 may be fastened to a surface such as a heat sink.

The cylinder 22 is resiliently coupled to the cylindrical wall 18 of the inner housing 12 by a plurality of resilient coupling members 21 each having the form of a strip. Alternatively, a single coupling member 21 may resiliently couple the cylinder 22 to the cylindrical wall 18.

Each coupling member 21 extends between an outer side-face 20 of the cylindrical wall 18 of peripheral rim 15 of the inner housing 12 and an inner side-face 24 of the cylinder 22 and frame 11 of the pressure element 13, respectively.

In the embodiment illustrated in FIG. 1, the two ends 25 of each of the resilient strips 21 are attached at a point of the outer side-face 20 of the inner housing 12 and inner side-face 24 of the pressure element 13, respectively, which are laterally spaced from one another. Each resilient strip 21 has a Z-shape as illustrated in FIG. 2. Other shapes for the resilient strip 21 are possible as well.

Figure 5:
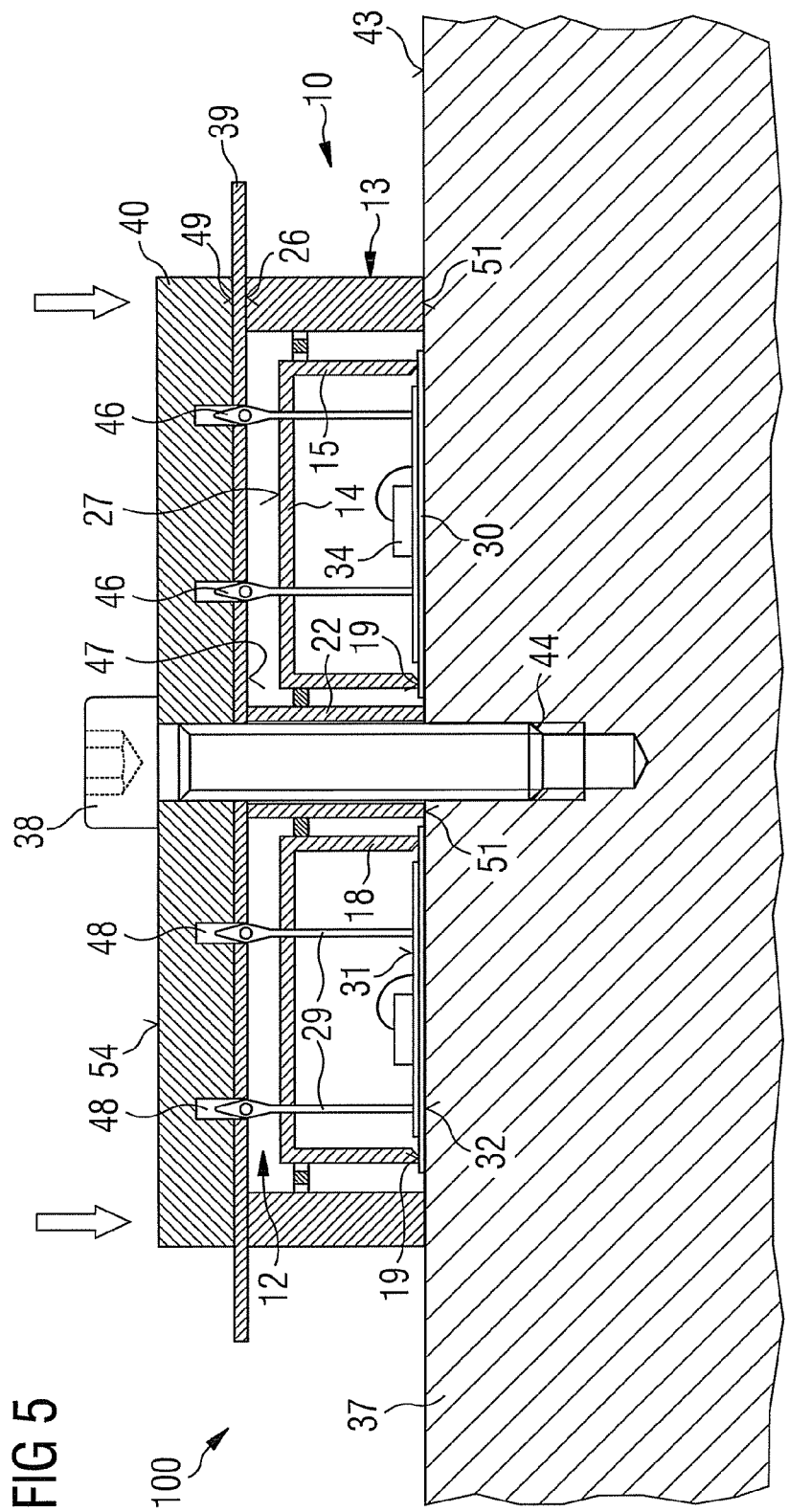
FIG. 5 illustrates a cross-sectional view of the assembly of the power semiconductor module of FIG. 3 in the assembled condition.

The pressure element 13 has a height which is slightly larger than the height of the peripheral rim 15 and cylindrical wall 18 of the inner housing 12. The height of the pressure element 13 determines the height of the assembled housing 10 as is illustrated in FIG. 5. The difference in height of the peripheral rim 15 and cylindrical wall 18 of the inner housing 12 may be few tenths of a millimeter. Other values are also possible.

The upper surface 26 of the pressure element 13 is positioned in a plane above the upper surface 27 of the cover 14 of the inner housing 10. The upper surface 26 of the pressure element 13 provides a pressure surface. Force may be applied to the upper surface 26 of the pressure element 13, for example via a generally plate type part extending between opposing sides of the frame 11 of the pressure element 13, without the plate coming into contact with the cover 14 of the inner housing 12. Alternatively, force may be selectively applied to only the cylinder 22 or only the frame 11 of the pressure element 13 of the housing 10.

The frame 11 of the pressure element 13 has a thickness which is greater than the thickness of the inner housing so as to provide a dimensionally stable element. The greater wall thickness of the frame 11 relative to the thickness of the inner housing enables force applied in a downward direct, which is parallel a vertical axis of the frame 11 indicating the height of the frame 11, to be distributed over a large contact area between the lower surface 19 of the frame 11 and a surface onto which it is pressed. This way, a reliable and homogeneous contact between the frame 11 and the surface onto which the frame 11 is pressed can be provided.

The cover 14 of the inner housing 12 also includes a plurality of second through-holes 28 as illustrated in FIG. 2 which have a diameter adapted to accommodate and guide a contact pin 29.

The pressure element 13, inner housing 12 and the resilient coupling strips 21 are provided in the form of a single plastic part which may be fabricated by injection molding in a single process step. Using injection molding, the housing 10 is simple and cost-effective to manufacture. The pressure element 13, the inner housing 12 and the resilient coupling strips 21 may be provided by separate parts. The resilient coupling strips 21 may be built along with either the pressure element 13 or the inner housing 12. In this case, the pressure element 13, the inner housing 12 and the resilient coupling strips 21 may be provided by two parts.

Further embodiments of the power semiconductor module 100 are also illustrated in FIG. 1. The power semiconductor module 100 also includes an electrically insulating substrate 30 which has a first primary surface 31 and a second primary surface 32 which opposes the first primary surface 31. In the embodiment of FIG. 1, the electrically insulating substrate 30 is a DCB—(Direct Copper Bonding) substrate including an electrically insulating ceramic body 33 of aluminium oxide, a plurality of structured copper conductor tracks (not illustrated in FIG. 1) arranged on the first primary surface 31 which provide a rewiring or conductive distribution structure and a closed copper layer generally covering the second primary surface 32. The ceramic substrate 30 also includes a through-hole 36 in approximately the lateral centre of the substrate 30.

The power semiconductor module 100 further includes a plurality of power semiconductor components 34 which, in the embodiment illustrated in FIG. 1, are power transistor devices. The power transistor devices 34 are mounted on the first primary surface 31 of the ceramic substrate 30 and are electrically connected to conductor tracks (not illustrated) by bond wires 35. A plurality of contact pins 29 are arranged on conductor tracks (not illustrated) and may be arranged perpendicularly to the first primary surface 31.

The housing 10 is arranged with respect to the electrically insulating substrate 30, plurality of power semiconductor components 34 and contact pins 29 such that the contact pins 29 are accommodated in the second through-holes 28 and such that the lower surface 19 of the peripheral rim 15 and cylindrical wall 18 of the inner housing 12 is positioned on the first primary surface 31 of the ceramic substrate 30. The plurality of power semiconductor components 34 are enclosed within the volume created by the inner housing 12 and the first primary surface 31 of the ceramic substrate 30. The pressure element 13 is arranged adjacent the ceramic substrate 30. The cylinder 22 of the pressure element 13 is arranged within through-hole 36 of the ceramic substrate 30 so as to be adjacent the ceramic substrate 30. The pressure element 13 of the housing 10 is spatially separated from the ceramic substrate 30 of the power semiconductor module 100.

Figure 3:
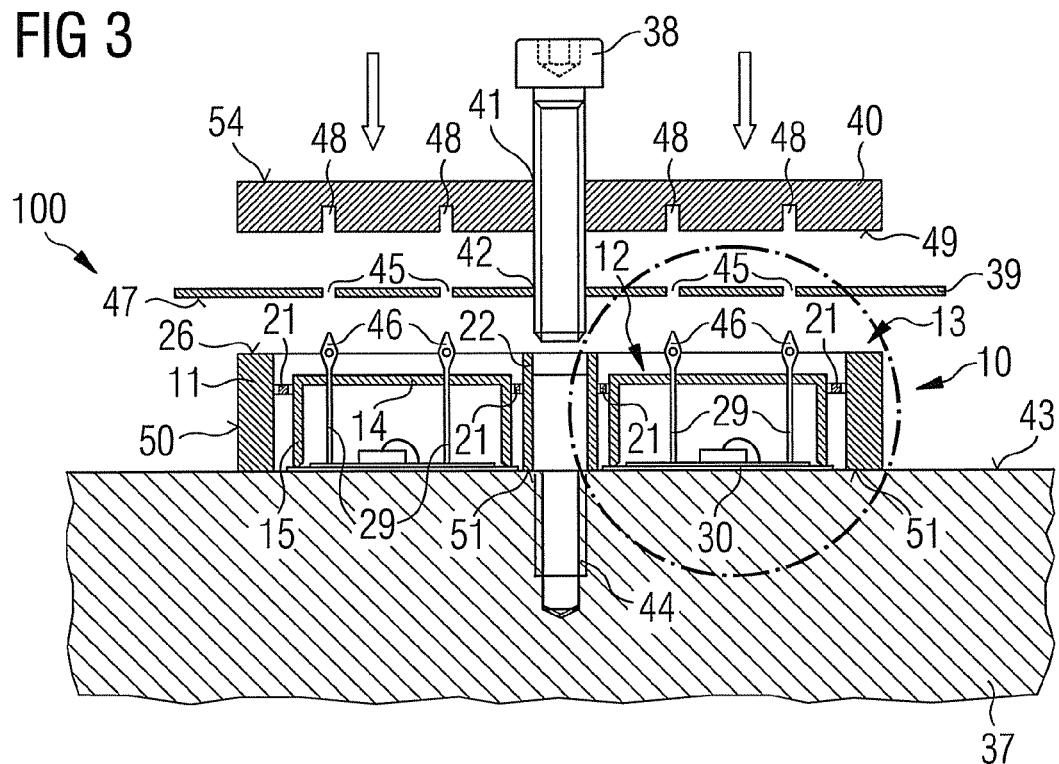
FIG. 3 illustrates a cross-sectional view of an assembly of a power semiconductor module including the housing of FIGS. 1 and 2.

FIG. 3 illustrates the assembly of the power semiconductor module 100 and its attachment to a heat sink 37 by a screw 38. As is illustrated in FIG. 3, the power semiconductor module 100 further includes a rewiring board 39 and pressure plate 40. The rewiring board 39 may be a printed circuit board.

The rewiring board 39 and pressure plate 40 each include a through-hole 41, 42, respectively, with a diameter approximately that of the diameter of the cylinder 22 of the pressure element 13 of the housing 10 and at least that of the screw 38. The diameter of the through-holes 41, 42 is adapted so as to guide the screw 38. The heat sink 37 has an upper surface 43 onto which the power semiconductor module 100 is mounted. The upper surface 43 includes a threaded closed-end hole 44 having a diameter and thread pitch adapted to mate with the thread of screw 38.

The ceramic substrate 30 and housing 10 having the arrangement as illustrated in FIG. 2 are positioned on the upper surface 43 of the heat sink 37 such that the through-hole 36 of the ceramic substrate 30 and through-hole 23 of the pressure element are 13 concentrically aligned with the threaded closed-end hole 44.

The rewiring board 39 includes a plurality of through-holes 45 at lateral positions corresponding to the lateral positions of the contact pins 29. The plurality of through-holes 45 have a diameter adapted to mate with a pressure contact 46 positioned towards the upwardly pointing end portions of each of the contact pins 29 when the rewiring board 39 is positioned on the upper surface 26 of the pressure element 13.

Since the upper surface 26 of the pressure element 13 is positioned in a plane which is higher with respect to the upper surface 43 of the heat sink 37 than the upper surface 27 of the inner housing were of, the lower surface 47 of the rewiring board 39 is spaced at a distance from the upper surface 27 of the cover 14 of the inner housing 12.

FIG. 5 illustrates the power semiconductor module 100 in the assembled condition in which the rewiring board 39 is positioned in contact with the upper surface 26 of the pressure element 13 so that the pressure contacts 46 of the contact pins 29 are pressed into the respective holes 45 of the rewiring board 39 so as to produce a contact between the contact pins 29 and conductor tracks (not illustrated) of the rewiring board 39 for transfer of electrical current.

The rewiring board 39 extends in at least one direction over the outer side-face 50 of the housing 10 so as to provide freely accessible contact areas in an edge region of the rewiring board 39. The semiconductor devices 34 within the housing 10 can be electrically accessed via the conductor tracks of the ceramic substrate 30, the contact pins 29 and the rewiring board 39.

The power semiconductor module 100 further includes a pressure plate 40. The pressure plate 40 includes a plurality of closed-end holes 48 in its lower surface 49 facing the rewiring board 39. The plurality of closed-end holes 48 have lateral positions which correspond to the lateral positions of the contact pins 29. Each of the plurality of closed-end holes 48 has a diameter of a size adapted to accommodate the end portions of the contact pins 29 such that the end portion does not come into contact with the pressure plate 40.

After the rewiring board 39 has been placed onto the upper surface 26 of the pressure element 13 thus producing the electrical connection between the pressure contacts 46 of the contact pins 29 and the rewiring board 39, the pressure plate 40 is positioned on the upper surface 50 of the rewiring board 39 such that the lower surface 49 of the pressure plate is in contact with the upper surface 50 of the rewiring board and the end portions of the contact pins 29 are accommodated within the through-holes 48 of the pressure plate 40.

At this stage in the assembly process, pressure has not been exerted on the housing 10 by the fastening means, which in the embodiment illustrated in FIG. 3 is the screw 38. Other fastening means such as a clip are also possible. The arrangement of the lower surface 51 of pressure element 13 of the housing 10 with respect to the upper surface 43 of the heat sink 37 is illustrated in the enlarged detailed view of FIG. 4.

Figure 4:
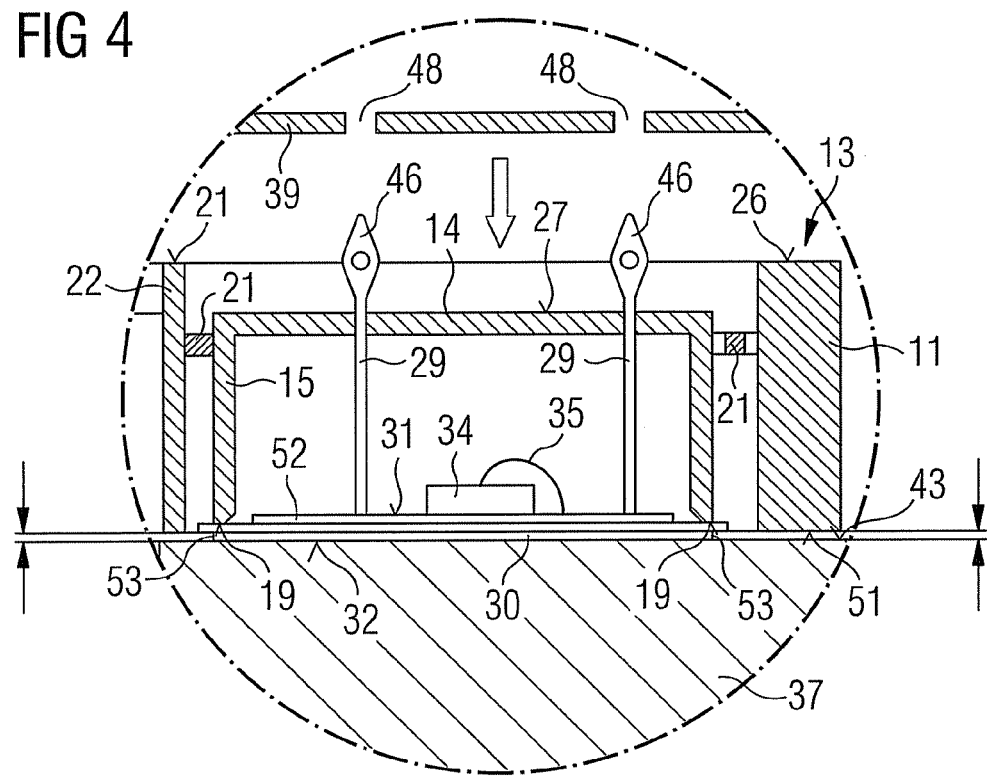
FIG. 4 illustrates a detailed cross-sectional view of the assembly of a power semiconductor module illustrated in FIG. 3.

As illustrated in FIG. 4, the lower surface 51 of pressure element 13 is spaced at a distance from the upper surface 43 of the heat sink 37. This distance may be in the order of a few tenths of a millimeter. The second primary surface 32 of the ceramic substrate 30 is in contact with the upper surface 43 of the heat sink 37 but is not yet attached to the heat sink 37. In the enlarged view of FIG. 4, conductor tracks 52 on the first primary surface 31 and the closed layer 53 on the second primary surface 32 of the ceramic substrate 30 are illustrated.

FIG. 5 illustrates the power semiconductor module 100 in the assembled condition. The screw 38 is positioned in the respective through-holes 42, 41, 23, 36 of the pressure plate 40, rewiring board 39, housing 10 and ceramic substrate 30 of the power semiconductor module 100 and mates with the threaded closed-end hole 44 of the heat sink 37. The contact pins 29 are accommodated freely within the closed-end holes 48 of the pressure plate 40. Without contact between the pressure plate 40 and the contact pins 29, the contact pins 29 remain unaffected by the force applied to the pressure plate 40 so that the electrical connection between the contact pins 29 and the rewiring board 39 is not adversely affected.

In the assembled condition illustrated in FIG. 5, the lower surface 51 of the pressure element 13 is in contact with the upper surface 43 of the heat sink 37 as a result of the downward pressure exerted by the tightened screw 38. The force exerted by the screw 38 may be controlled for example by limiting the torque applied by a wrench to the screw 38.

The lower surface 49 of the pressure plate 40 is in contact with the upper surface 50 of the rewiring board 39. The force exerted by the screw 38 on the upper surface 54 of pressure plate 40 is transferred to the pressure element 13 of the housing 10 via the rewiring board 39 which is in contact with both the pressure plate 40 and the pressure element 13 of the housing 10. This downward force attaches the pressure element 13 to the heat sink 37.

A downward force (see arrows in FIG. 5) is also exerted on the peripheral rim 15 and cylindrical wall 18 of the inner housing 12 of the housing 10 via the pressure element 13 and the resilient coupling members 21. The downward force exerted by the inner housing 12 on the ceramic substrate 30 attaches the ceramic substrate 30 to the heat sink 37.

The resilient coupling members 21 act to limit the force which is exerted by the inner housing 12 on the ceramic substrate 30. The resilient coupling members 21 are provided with the desired resilience so as to provide the desired transfer of the pressure from the pressure element 13 to the inner housing 12. This may be achieved by selecting the material of the resilient coupling members 21 or by appropriately adapting their shapes and/or dimensions and/or their position between the pressure element 13 and the inner housing 12.

The arrangement of a pressure element 13 adjacent to the outer side-faces 15 of the inner housing 12 and adjacent to the ceramic substrate 30 along with the resilient coupling of the pressure element 13 to the inner housing 12 enables the housing 10 to be firmly attached to the upper surface 43 of the heat sink 37 by the pressure exerted by the screw 38 while limiting the pressure which is exerted on the ceramic substrate 30. Such an arrangement reduces the chance of a substrate to break due to excessive force while providing a good contact between the ceramic substrate 30 and the heat sink 37 to enable efficient heat dissipation from the power semiconductor module 100 into the heat sink 37.

The embodiment illustrated in FIG. 5 is a detachable arrangement of the housing 10 and the electrically insulating substrate 32 to the heat sink 37. However, should a fixed attachment be desired, an adhesive may be provided between the upper surface 43 of the heat sink 37 and the second primary surface 32 of the ceramic substrate 30 and the lower surface 51 of the pressure element 13 of the housing 10.

The pressure element 13 is illustrated in FIGS. 1 to 5 as having the form of closed frame 11 and closed cylinder 22 positioned adjacent outer side-faces 20 of the inner housing 12. The pressure element 13 may also be provided by a plurality of pressure members which are not directly connected to one another but which are resiliently coupled to the inner housing 12. For example, the frame 11 may be replaced by four members which are not directly connected to one another and which have a generally rectangular arrangement. These four members may be positioned concentrically adjacent to the outer side-faces 20 of the peripheral rim 15 of the inner housing 12. Such an arrangement may be used to accommodate non-uniformities in the surface to which the housing is to be attached.

The power semiconductor module 100 may be fastened to a surface by means other than a single screw. For example, a plurality of screws, for example four screws, may be provided. In this case, the cover 14, housing 12, the substrate 30, the rewiring board 39 and the pressure plate 40 include a plurality of through-holes each adapted to accommodate a screw. For example, a screw may be positioned towards each corner of the housing 10.

The fastening means may also be provided in the form of a clip which extends between the upper surface 54 of the pressure plate and the surface 43 of the heat sink 37 or a surface adjacent the power semiconductor module 100. In this case, the housing 10 as well as the rewiring board and pressure plate need not include through-holes intended to guide the fastening means such as a screw. The housing 10 may in this case include a single pressure element 13 in the form of a frame positioned adjacent the outer side-faces 20 of the peripheral rim 15 of the inner housing 10.

The housing may also include one or more notches in the peripheral rim 15 of the inner housing to enable a cooling medium to enter the housing. The cooling medium may be a forced airflow or a liquid cooling medium, for example.

In other embodiments (not illustrated) of the power semiconductor module 100, the electrical contact between the contact pins 29 and the rewiring board 39 may be provided by solder or wire bonding connections rather than pressure contact connections.

The rewiring board 39 may have the form of an adapter board having appropriate connections on one or more sides for connection to a higher order printed circuit board.

The power semiconductor module 100 may further include passive electronic components and further semiconductor components such as control chips which are also positioned on the first primary surface 31 of the ceramic substrate 30.

The electrically insulating substrate may be a ceramic substrate such as IMS (aluminium polyimide copper) or aluminium nitride.

The pressure plate 40 may include a plurality of cutouts in the form of a closed end hole or a through hole to accommodate the end portions of the contact pins 29. The pressure plate 40 may be provided with a peripheral rim extending from its lower surface which has dimensions adapted to correspond to the pressure element 13 of the housing 10. The end portions of the contact pins 29 may be accommodated between opposing sides of this peripheral rim so as to not to make contact with the pressure plate 40.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor assembly comprising:
   a housing comprising an inner housing comprising a cover and a peripheral rim; and
   at least one pressure element including a frame arranged adjacent a side-face of the peripheral rim, the inner housing being arranged within the frame, the pressure element being resiliently coupled to the inner housing by a plurality of resilient coupling members, and where the pressure element, the inner housing, and the resilient coupling members are provided in the form of a single plastic part.

2. The assembly of claim 1, comprising:
   an electrically insulating substrate.

3. The assembly of claim 1, comprising wherein the resilient coupling members are provided by various resilient elements, strips, cantilevers, or hollow sections.

4. The assembly of claim 1, comprising wherein an upper surface of the pressure element protrudes beyond an upper surface of the inner housing.

5. The assembly of claim 1, comprising wherein the frame is arranged generally concentrically outside of an outer side-face of the peripheral rim of the inner housing and is spaced at a distance from the outer side-face of the inner housing.

6. The assembly of claim 1, comprising wherein the cover further includes a first through-hole, the first through-hole being adapted to provide a guide for a screw with which the housing is fastenable to a heat sink.

7. The assembly of claim 6, comprising wherein the cover further comprises a plurality of second through-holes, each second through-hole being adapted to provide a guide for a force fitted contact pin.

8. The assembly of claim 1, wherein
the cover is generally planar; and
the peripheral rim extends from a lower surface of the cover and is oriented generally perpendicular to the cover such that the side face of the peripheral rim is perpendicular to the cover.

9. A power semiconductor module, comprising:
an electrically insulating substrate comprising an electrically insulating body having a first primary surface and a second primary surface;
at least one power semiconductor component mounted on the first primary surface of the electrically insulating substrate, and
a housing comprising an inner housing comprising a cover and a peripheral rim, and at least one pressure element including a pressure element frame arranged adjacent a side-face of the peripheral rim, the inner housing being arranged within the pressure element frame, the pressure element being resiliently coupled to the inner housing by a plurality of resilient coupling members, and where the pressure element, the inner housing, and the resilient coupling members are provided in the form of a single plastic part.

10. A power semiconductor module, comprising:
an electrically insulating substrate comprising an electrically insulating body having a first primary surface and a second primary surface;
at least one power semiconductor component mounted on the first primary surface of the, electrically insulating substrate, and
a housing comprising an inner housing comprising a cover and a peripheral rim, and at least one pressure element including a pressure element frame arranged adjacent a side-face of the peripheral rim, the inner housing being arranged within the pressure element frame, the pressure element being resiliently coupled to the inner housing; and
comprising wherein the housing is configured such that in an unattached condition, a lower surface of the peripheral rim of the inner housing is arranged in contact with a first primary surface of the electrically insulating substrate and the at least one pressure element is arranged adjacent a side-face of the electrically insulating substrate and is adjacent and spaced at a distance from a surface to which the attachment of the housing and the electrically insulating substrate is to be detachedly attached.

11. The power semiconductor module of claim 9, comprising wherein the housing is configured such that in an attached condition, the lower surface of the peripheral rim of the inner housing is in contact with the first primary surface of the electrically insulating substrate and the at least one pressure element is arranged adjacent a side-face of the electrically insulating substrate and in contact with a surface to which the housing and a second primary surface of the electrically insulating substrate is attached as a result of pressure exerted on the upper surface of the pressure element.

12. The power semiconductor module of claim 9, comprising wherein the pressure element is resiliently coupled to the inner housing by a plurality of resilient strips.

13. The power semiconductor module of claim 9, comprising wherein the pressure element frame is arranged generally concentrically outside of an outer side-face of the peripheral rim of the inner housing and is spaced at a distance from the outer side-face of the inner housing.

14. The power semiconductor module of claim 9, further comprising:
a pressure plate and fastening mechanism.

15. The power semiconductor module of claim 14, comprising wherein the pressure plate is arranged on an upper surface of the pressure element of the housing.

16. The power semiconductor module of claim 14, comprising wherein the fastening mechanism is arranged so that the pressure plate exerts a force on the pressure element so as to attach the housing and the electrically insulating substrate to a surface.

17. A power semiconductor module comprising:
an electrically insulating substrate;
at least one power semiconductor component arranged on the electrically insulating substrate;
a housing comprising an inner housing comprising a cover and a peripheral rim, and at least one pressure element including a frame arranged adjacent a side-face of the peripheral rim, the inner housing being arranged within the frame, the pressure element being resiliently coupled to the inner housing;
a pressure plate being arranged on a printed circuit board at least in regions directly above the pressure element, and
fastening means for exerting pressure on the pressure element so as to attach the housing and the electrically insulating substrate to a surface.

18. The power semiconductor module of claim 17, comprising wherein the pressure element is resiliently coupled to the inner housing by a plurality of various resilient elements or strips.

19. The power semiconductor module of claim 17, comprising wherein the pressure element is the frame arranged generally concentrically outside of an outer side-face of the peripheral rim of the inner housing and is spaced at a distance from the outer side-face of the inner housing.

20. The power semiconductor module of claim 17, comprising wherein the printed circuit board is electrically connected to the at least one power semiconductor component by contact pins extending between the electrically insulating substrate.

21. The power semiconductor module of claim 17, wherein the pressure plate further comprises a plurality of cutouts, each cutout being adapted to accommodate an end of contact pin.

22. A semiconductor assembly comprising:
a housing comprising an inner housing comprising a cover and a peripheral rim, and wherein the cover and the peripheral rim of the inner housing are made of one piece; and
at least one pressure element including a frame arranged adjacent a side-face of the peripheral rim, the inner housing being arranged within the frame, the pressure element being resiliently coupled to the inner housing by a plurality of resilient coupling members, and where the pressure element, the inner housing, and the resilient coupling members are provide in the form of a single plastic part.

23. The assembly of claim 8, wherein the pressure element is oriented generally parallel to the peripheral rim and is arranged generally concentrically outside of an outer side-face of the peripheral rim of the inner housing and is laterally spaced at a distance from the outer side-face of the inner housing.

* * * * *